US008031752B1

(12) United States Patent
Johnson et al.

(10) Patent No.: US 8,031,752 B1
(45) Date of Patent: Oct. 4, 2011

(54) VCSEL OPTIMIZED FOR HIGH SPEED DATA (75) Inventors: Ralph H. Johnson, Murphy, TX (US);
James K. Guenter, Garland, TX (US);
James R. Biard, Richardson, TX (US)

(73) Assignee: Finisar Corporation, Sunnyvale, CA (US)

( * ) Notice: Subject to any disclaimer, the term of this patent is extended or adjusted under 35 U.S.C. 154(b) by 308 days.

(21) Appl. No.: 12/340,286

(22) Filed: Dec. 19, 2008

Related U.S. Application Data (63) Continuation-in-part of application No. 11/735,993, filed on Apr. 16, 2007, now Pat. No. 7,829,912.

(60) Provisional application No. 61/015,949, filed on Dec. 21, 2007.

(51) Int. Cl.
*H01S 5/00* (2006.01)

(52) U.S. Cl. .............. 372/43.01; 372/45.01; 372/46.01; 372/50.1; 372/50.124

(58) Field of Classification Search .............. 372/43.01, 372/45.01, 46.01, 50.1, 50.124
See application file for complete search history.

(56) References Cited

U.S. PATENT DOCUMENTS

| | | | |
|---|---|---|---|
| 4,317,085 A | 2/1982 | Burnham et al. | |
| 4,466,694 A | 8/1984 | MacDonald | |
| 4,660,207 A | 4/1987 | Svilans | |
| 4,675,058 A | 6/1987 | Plaster | |
| 4,784,722 A | 11/1988 | Liau et al. | |
| 4,882,734 A | 11/1989 | Scifres | |
| 4,885,592 A | 12/1989 | Kofol et al. | |
| 4,901,327 A | 2/1990 | Bradley | |
| 4,943,970 A | 7/1990 | Bradley | |
| 4,956,844 A | 9/1990 | Goodhue et al. | |
| 5,031,187 A | 7/1991 | Orenstein et al. | |
| 5,052,016 A | 9/1991 | Mahbobzadeh | |
| 5,056,098 A | 10/1991 | Anthony et al. | |
| 5,062,115 A | 10/1991 | Thornton | |
| 5,068,869 A | 11/1991 | Wang et al. | |
| 5,079,774 A | 1/1992 | Mendez et al. | |
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,216,263 A | 6/1993 | Paoli | |

(Continued)

FOREIGN PATENT DOCUMENTS

DE 4240706 3/1992

(Continued)

OTHER PUBLICATIONS

Chang et al., "Theoretical and Experimental Analysis on InAlGaAs/AlGaAs Active Region of 850-nm Vertical-Cavity Surface-Emitting Lasers," Journal of Lightwave Technology, vol. 24, No. 1, Jan. (2006).

(Continued)

*Primary Examiner* — Dung T Nguyen
(74) *Attorney, Agent, or Firm* — Maschoff Gilmore & Israelsen (57) ABSTRACT

A Vertical Cavity Surface Emitting Laser (VCSEL) is optimized for longer life of the VCSEL by controlling the distance of doped and undoped layers near an active region. In addition, the VCSEL optimized for reduced parasitic lateral current under an oxide of the VCSEL by forming a high Al confinement region and placing the oxide at a null in a standing optical wave. Further, the VCSEL is optimized to reduce resistance.

8 Claims, 5 Drawing Sheets

U.S. PATENT DOCUMENTS

| | | | |
|---|---|---|---|
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,319,660 A | 6/1994 | Chen et al. |
| 5,325,386 A | 6/1994 | Jewell et al. |
| 5,331,654 A | 7/1994 | Jewell et al. |
| 5,331,655 A | 7/1994 | Harder |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodzinski et al. |
| 5,561,683 A | 10/1996 | Kwon |
| 5,567,980 A | 10/1996 | Holonyak, Jr. et al. |
| 5,568,499 A | 10/1996 | Lear |
| 5,574,738 A | 11/1996 | Morgan |
| 5,574,744 A | 11/1996 | Gaw et al. |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Klem et al. |
| 5,648,978 A | 7/1997 | Sakata |
| 5,696,023 A | 12/1997 | Holonyak, Jr. et al. |
| 5,699,373 A | 12/1997 | Uchida et al. |
| 5,712,188 A | 1/1998 | Chu et al. |
| 5,724,374 A | 3/1998 | Jewell |
| 5,726,805 A | 3/1998 | Kaushik et al. |
| 5,727,013 A | 3/1998 | Botez et al. |
| 5,727,014 A | 3/1998 | Wang et al. |
| 5,745,515 A | 4/1998 | Marta et al. |
| 5,774,487 A | 6/1998 | Morgan |
| 5,778,018 A | 7/1998 | Yoshikawa et al. |
| 5,784,399 A | 7/1998 | Sun |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,940,422 A | 8/1999 | Johnson |
| 5,953,362 A | 9/1999 | Pamulapati et al. |
| 5,959,307 A | 9/1999 | Nakamura et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,055,262 A | 4/2000 | Cox et al. |
| 6,078,601 A | 6/2000 | Smith |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thorton |
| 6,212,312 B1 | 4/2001 | Grann et al. |
| 6,238,944 B1 | 5/2001 | Floyd |
| 6,266,357 B1 | 7/2001 | Feld et al. |
| 6,269,109 B1 | 7/2001 | Jewell |
| 6,297,068 B1 | 10/2001 | Thornton |
| 6,317,446 B1 | 11/2001 | Wipiejewski |
| 6,320,893 B1 | 11/2001 | Ueki |
| 6,372,533 B2 | 4/2002 | Jayaraman et al. |
| 6,411,638 B1 | 6/2002 | Johnson et al. |
| 6,459,713 B2 | 10/2002 | Jewell |
| 6,545,335 B1 | 4/2003 | Chua et al. |
| 6,570,905 B1 | 5/2003 | Ebeling |
| 6,628,694 B2 | 9/2003 | Deng et al. |
| 6,700,914 B2 | 3/2004 | Yokouchi et al. |
| 6,727,520 B2 | 4/2004 | Morgan et al. |
| 6,782,027 B2 | 8/2004 | Cox et al. |
| 6,829,283 B2 | 12/2004 | Ebeling |
| 6,990,135 B2 | 1/2006 | Johnson et al. |
| 7,026,653 B2 | 4/2006 | Sun |
| 7,065,124 B2 | 6/2006 | Biard et al. |
| 7,251,264 B2 | 7/2007 | Johnson et al. |
| 7,596,165 B2 | 9/2009 | Johnson |
| 2001/0043629 A1 | 11/2001 | Sun et al. |
| 2001/0050934 A1 | 12/2001 | Choquette et al. |
| 2002/0101899 A1 | 8/2002 | Yokouchi et al. |
| 2002/0154675 A1 | 10/2002 | Deng et al. |
| 2003/0123513 A1 | 7/2003 | Villareal |
| 2003/0123514 A1 | 7/2003 | Cox et al. |
| 2004/0081215 A1 | 4/2004 | Johnson |
| 2005/0031011 A1 | 2/2005 | Biard et al. |
| 2005/0127391 A1 | 6/2005 | Yamamoto |
| 2006/0093010 A1* | 5/2006 | Sekiya et al. ............ 372/99 |
| 2006/0268954 A1 | 11/2006 | Johnson |
| 2009/0003399 A1* | 1/2009 | Taylor ............ 372/50.1 |
| 2009/0115346 A1 | 5/2009 | Walter |

FOREIGN PATENT DOCUMENTS

| | | |
|---|---|---|
| EP | 0288184 A2 | 10/1988 |
| EP | 536944 | 4/1993 |
| EP | 0776076 A1 | 5/1997 |
| JP | 60123084 | 1/1985 |
| JP | 02054981 | 2/1990 |
| JP | 5206574 | 8/1993 |
| JP | 5299779 | 11/1993 |
| JP | 10-510100 | 9/1998 |
| JP | 2000294872 | 10/2000 |
| JP | 2002217491 | 8/2002 |
| WO | 9619856 | 6/1996 |
| WO | WO 98/57402 | 12/1998 |
| WO | 02/34630 | 5/2002 |
| WO | WO 02/37630 | 10/2002 |
| WO | 2004/033557 | 4/2004 |
| WO | PCT/US0333611 | 7/2004 |
| WO | WO2008/016828 | 2/2008 |
| WO | PCT/US/07/074480 | 7/2008 |

OTHER PUBLICATIONS

Chang et al., "The Carrier Blocking Effect on 850nm InAlGaAs/AlGaAs Vertical-Cavity Surface-Emitting Lasers," Institute of Physics Publishing, Semiconductor Science and Technology, 21, (2006), pp. 1488-1494.
3779187.8, Aug. 31, 2005, EP Office Action.
1020057006453.00, Aug. 29, 2006, KR Office Action.

PI20070984, Feb. 12, 2010, MY Office Action.
CN 200710126012.9, Feb. 27, 2009, CN Office Action.
CN 200710126012.9, Aug. 7, 2009, CN Office Action.
JP 2004548434, Jul. 22, 2009, JP Office Action.
Banwell et al., "VCSE Laser Transmitters for Parallel Data Links", *IEEE Journal of Quantum Electronics*, vol. 29, No. 2, Feb. 1993, pp. 635-644.
Ben G. Streetman and Sanjay Jumar Banerjee, "Solid State Electronic Devices" Sixth Edition Prentice Hall, p. 228.
Bowers et al., "Fused Vertical Cavity Lasers With Oxide Aperture", Final report for MICRO project 96-042, Industrial Sponsor: Hewlett Packard, 4 pgs, 1996-97.
Catchmark et al., "High Temperature CW Operation of Vertical Cavity Top Surface-Emitting Lasers", CLEO 1993, p. 138.
Chemla et al., "Nonlinear Optical Properties of Semiconductor Quantum Wells", *Optical Nonlinearities and Instabilities in Semiconductors*, Academic Press, Inc., Copyright 1988, pp. 83-120.
Choe, et al., "Lateral oxidation of AIAs layers at elevated water vapour pressure using a closed-chamber system," Letter to the Editor, Semiconductor Science Technology, 15, pp. L35-L38, Aug. 2000.
Choa et al., "High-Speed Modulation of Vertical-Cavity Surface-Emitting Lasers", *IEEE PhotonicsTechnology Letter*, vol. 3, No. 8, Aug. 1991, pp. 697-699.
Choquette, Kent D. et al., Design of Oxide Aperture Profile within Selectively Oxidized VCSELs, IEEE, Conference Proceedings, LEOS '98, 11$^{th}$ Annual Meeting, Orlando, Florida, Dec. 1-4, 1998, pp. 179-180.
Choquette et al., "High Single Mode Operation from Hybrid Ion Implanted/Selectively Oxidized VCSELs", 2000 IEEE 17th International Semiconductor Laser Conference; Monterrey, CA, pp. 59-60.
Choquette et al., "Lithographically-Defined Gain Apertures Within Selectively Oxidized VCSELs", paper CtuL6, Conference on Lasers and Electro-Optics, San Francisco, California (2000).
Choquette, et al., "VCSELs in information systems: lOGbps$^{-1}$ oxide VCSELs for data communication", Optics in Information Systems, vol. 12, No. 1, p. 5, SPIE International Technical Group Newsletter, Apr. 2001.
Chua, et al., "Low-Threshold 1.57—µ m VC-SEL's Using Strain-Compensated Quantum Wells and Oxide/Metal Backmirror," IEEE Photonics Technology Letters, vol. 7, No. 5, pp. 444-446, May 1995.
Chua, et al, "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.
Cox, J. A., et al., "Guided Mode Grating Resonant Filters for VCSEL Applications", *Proceedings of the SPIE*, The International Society for Optical Engineering, Diffractive and Holographic Device Technologies and Applications V; San Jose, California, Jan. 28-29, 1998, vol. 3291, pp. 70-71.
Farrier, Robert G., "Parametric control for wafer fabrication: New CIM techniques for data analysis," Solid State Technology, pp. 99-105, Sep. 1997.
Fushimi, et al., "Degradation Mechanism in Carbon-doped GaAs Minority-carrier Injection Devices," 34th Annual IRPS Proceedings; Dallas, TX, Apr. 29-May 2, 1996, 8 pages.
G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.
G. Shtengel et al., "High-Speed Vertical-Cavity Surface-Emitting Lasers", *Photon. Tech. Lett.*, vol. 5, No. 12, pp. 1359-1361 (Dec. 1993).
Geib, et al., "Comparison of Fabrication Approaches for Selectively Oxidized VCSEL Arrays," Proceedings of SPIE, vol. 3946, pp. 36-40, 2000.
Graf, Rudolph, *Modem Dictionary of Electronics*, 6th ed., Indiana: Howard W. Sams & Company, 1984, p. 694.
Guenter et al., "Reliability of Proton-Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.
Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.
Hawthorne, et al., "Reliability Study of 850 nm VCSELs for Data Communications," IEEE, pp. 1-11, May 1996.
Herrick, et al., "Highly reliable oxide VCSELs manufactured at HP/Agilent Technologies," Invited Paper, Proceedings of SPIE vol. 3946, pp. 14-19, 2000.
Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.
Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.
Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.
Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.
Jewell et al., "Surface Emitting Microlasers for Photonic Switching & Intership Connections", *Optical Engineering*. vol. 29, No. 3, pp. 210-214, Mar. 1990.
Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.
K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.
Kash, et al., "Recombination in GaAs at the AIAs oxide-GaAs interface," Applied Physics Letters, vol. 67, No. 14, pp. 2022-2024, Oct. 2, 1995.
Kishino et al., "Resonant Cavity-Enhanced (RCE) Photodetectors", *IEEE Journal of Quantum Electronics*, vol. 27, No. 8, pp. 2025-2034.
Koley B., et al., "Dependence of lateral oxidation rate on thickness of AIAs layer of interest as a current aperture in vertical-cavity surface-emitting laser structures", Journal of Applied Physics, vol. 84, No. 1, pp. 600-605, Jul. 1, 1998.
Kuchibhotla et al., "Low-Voltage High Gain Resonant Cavity Avalanche Photodiode", *IEEE Phototonics Technology Letters*, vol. 3, No. 4, pp. 354-356.
Lai et al., "Design of a Tunable GaAs/AlGaAs Multiple-Quantum-Well Resonant Cavity Photo detector", *IEEE Journal of Quantum Electronics*, vol. 30, No. 1, pp. 108-114.
Lee et al., "Top-Surface Emitting GaAs Four-Quantum-Well Lasers Emitting at 0-85 um", *Electronics Letters*, vol. 24, No. 11, May 24, 1990, pp. 710-711.
Lehman et al., "High Frequency Modulation Characteristics of Hybrid Dielectric/AIGaAs Mirror Singlemode VCSELs", *Electronic Letters*, vol. 31, No. 15, Jul. 20, 1995, pp. 1251-1252.
Maeda, et al., "Enhanced Glide of Dislocations in GaAs Single Crystals by Electron Beam Irradiation," Japanese Journal of Applied Physics, vol. 20, No. 3, pp. L165-L168, Mar. 9, 1981.
Magnusson, "Integration of Guided-Mode Resonance Filters and VCSELs", Electo-Optics Research Center, Department of Electrical Engineering, University of Texas at Arlington, May 6, 1997.
Martinsson et al., "Transverse Mode Selection in Large-Area Oxide-Confined Vertical-Cavity Surface-Emitting Lasers Using a Shallow Surface Relief", *IEEE Photon. Technol. Lett.*, 11(12), 1536-1538 (1999).
Miller et al., "Optical Bistability Due to Increasing Absorption", *Optics Letters*, vol. 9, No. 5, May 1984, pp. 162-164.
Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", *IEEE Photonics Technology Letters*, vol. 7, No. 5, May 1995, pp. 441-443.
Morgan et al., "High-Power Coherently Coupled 8×8 Vertical Cavity Surface Emitting Laser Array", *Appl. Phys Letters*, vol. 61, No. 10; Sep. 7, 1992, pp. 1160-1162.
Morgan et al., "Hybrid Dielectric/ AlGaAs Mirror Spatially Filtered Vertical Cavity Top-Surface Emitting Laser", *Appl. Phys. Letters*, vol. 66, No. 10, Mar. 6, 1995, pp. 1157-1159.
Morgan et al., "Novel Hibrid-DBR Single-Mode Controlled GaAs Top-Emitting VCSEL with Record Low Voltage", 2 pages, dated prior to Dec. 29, 2000.
Morgan et al., "One Watt Vertical Cavity Surface Emitting Laser", *Electron. Lett.*, vol. 29, No. 2, pp. 206-207, Jan. 21, 1993.
Morgan et al., "Producible GaAs-based MOVPE-Grown Vertical-Cavity Top-Surface Emitting Lasers with Record Performance", *Elec. Lett.*, vol. 31, No. 6, pp. 462-464, Mar. 16, 1995.
Morgan et al., "Progress and Properties of High-Power Coherent Vertical Cavity Surface Emitting Laser Arrays", *SPIE*, vol. 1850, Jan. 1993, pp. 100-108.
Morgan et al., "Progress in Planarized Vertical Cavity Surface Emitting Laser Devices and Arrays", *SPIE*, vol. 1562, Jul. 1991, pp. 149-159.
Morgan et al., "Spatial-Filtered Vertical-Cavity Top Surface-Emitting Lasers", *CLEO*, 1993, pp. 138-139.
Morgan et al., "Submilliamp, Low-Resistance, Continuous-Wave, Single-Mode GaAs Planar Vertical-Cavity Surface Emitting Lasers", Honeywell Technology Center, Jun. 6, 1995.
Morgan et al., "Transverse Mode Control of Vertical-Cavity Top-Surface Emitting Lasers", *IEEE Photonics Technology Letters*, vol. 4, No. 4, Apr. 1993, pp. 374-377.
Morgan et al., "Vertical-cavity surface-emitting laser arrays", Invited Paper, *SPIE*, vol. 2398, Feb. 6, 1995, pp. 65-93.
Morgan et al., Vertical-cavity surface emitting lasers come of age, Invited paper, *SPIE*, vol. 2683, 0-8194-2057, Mar. 1996, pp. 18-29.
Morgan, "High-Performance, Producible Vertical Cavity Lasers for Optical Interconnects", *High Speed Electronics and Systems*, vol. 5, No. 4, Dec. 1994, pp. 65-95.
Naone RL., et al., "Tapered-apertures for high-efficiency miniature VCSELs", LEOS newsletter, vol. 13, No. 4, pp. 1-15, Aug. 1999.
Nugent et al., "Self-Pulsations in Vertical-Cavity Surface-Emitting Lasers", *Electronic Letters*, vol. 31, No. 1, Jan. 5, 1995, pp. 43-44.
Oh, T. H. et al., "Single-Mode Operation in Antiguided Vertical-Cavity Surface-Emitting Laser Using a Low-Temperature Grown AlGaAs Dielectric Aperture", *IEEE Photon. Technol. Lett.* 10(8), 1064-1066 (1998).
Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.
Peck, D. Stewart, Comprehensive Model for Humidity Testing Correlation, IEEE/IRPS, pp. 44-50, 1986.
Ries, et al., "Visible-spectrum (λ=650nm) photopumped (pulsed, 300 K) laser operation of a vertical-cavity AlAs-AlGaAs/InAlP-InGaP quantum well heterostructure utilizing native oxide mirrors," Applied Physics Letters, vol. 67, No. 8, pp. 1107-1109, Aug. 21, 1995.
S.S. Wang and R Magnusson, "Multilayer Waveguide-Grating Filters", *Appl. Opt.*, vol. 34, No. 14, pp. 2414-2420, 1995.
S.S. Wang and R Magnusson, "Theory and Applications of Guided-Mode Resonance Filters", *Appl. Opt.*, vol. 32, No.14, pp. 2606-2613, 1993.
Sah, et al., "Carrier Generation and Recombination in *P-N*. Junctions and *P-N*. Junction Characteristics," Proceedings of the IRE, pp. 1228-1243, Sep. 1957.

Schubert, "Resonant Cavity Light-Emitting Diode", *Appl. Phys. Lett.*, vol. 60, No. 8, pp. 921-923, Feb. 24, 1992.
Shi, et al., "Photoluminescence study of hydrogenated aluminum oxide-semiconductor interface," Applied Physics Letters, vol. 70, No. 10, pp. 1293-1295, Mar. 10, 1997.
Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203.
Spicer, et al., "The Unified Model For Schottky Barrier Formation and MOS Interface States in 3-5 Compounds," Applications of Surface Science, vol. 9, pp. 83-101, 1981.
Sugimoto, M., et al. "Very Low Threshold Current Density in Vertical-Cavity Surface-Emitting Laser Diodes with Periodically Doped Distributed Bragg Reflectors," Electronic Letters, IEE Stevenage, GB, vol. 28, No. 4, 1992.
Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11; Nov. 1, 1994, pp. 1971-1975.
T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.
Tao, Andrea, "Wet-Oxidation of Digitally Alloyed AlGaAs," National Nanofabrication Users Network, Research Experience for Undergraduates 2000, 2 pages.
Tatum, et al., Commerialization of Honeywell's VCSEL Technology, Published in Proceedings of the SPIE, vol. 3946, SPI, 2000, 12 pages.
Tshikazu Mukaihara, et al., "A Novel Birefringent Distributed Bragg Reflector Using a Metal/Dielectric Polarizer for Polarization Control of Surface-Emitting Lasers," Japan Appl. Phys. vol. 33 (1994) pp. L227-L229, Part 2, No. 2B, Feb. 15, 1994.
Tu, Li-Wei et al., "Transparent conductive metal-oxide contacts in vertical-injection top-emitting quantum well lasers", Appl. Phys. Lett. 58 (8) Feb. 25, 1991, pp. 790-792.
Wieder, H.H., "Fermi level and surface barrier of $Ga_xIn_{1-x}$ As alloys," Applied Physics Letters, vol. 38, No. 3, pp. 170-171, Feb. 1, 1981.
Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.
Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.
Yablonovitch et al., "Photonic Bandgap Structures", *J. Opt. Soc. Am. B.*, vol. 10, No. 2, pp. 283-295, Feb. 1993.
Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.
U.S. Appl. No. 11/735,993, filed Sep. 17, 2008, Restriction Requirement.
U.S. Appl. No. 11/735,993, filed Feb. 20, 2009, Restriction Requirement.
U.S. Appl. No. 11/735,993, filed May 29, 2009, Office Action.
U.S. Appl. No. 11/735,993, filed Jan. 7, 2010, Final Office Action.
U.S. Appl. No. 11/735,993, filed Mar. 11, 2010, Notice of Allowance.
U.S. Appl. No. 11/461,353, filed Oct. 18, 2007, Office Action.
U.S. Appl. No. 11/461,353, filed Jun. 18, 2008, Final Office Action.
U.S. Appl. No. 11/461,353, filed Jan. 6, 2009, Office Action.
U.S. Appl. No. 11/461,353, filed Jul. 8, 2009, Office Action.
U.S. Appl. No. 11/461,353, filed May 10, 2010, Office Action.

* cited by examiner

VCSEL OPTIMIZED FOR HIGH SPEED DATA

CROSS-REFERENCE TO RELATED APPLICATIONS

This application claims the benefit of U.S. Provisional Patent Application Ser. No. 61/015,949 entitled VCSEL OPTIMIZED FOR HIGH SPEED DATA, filed Dec. 21, 2007, and incorporated herein in its entirety by this reference. This application is also a Continuation-in-Part of U.S. patent application Ser. No. 11/735,993, titled EFFICIENT CARRIER INJECTION IN A SEMICONDUCTOR DEVICE, filed Apr. 16, 2007, which is incorporated herein in its entirety by this reference.

BACKGROUND OF THE INVENTION

1. The Field of the Invention

The invention generally relates to lasers. More specifically, the invention relates to Vertical Cavity Surface Emitting Lasers (VCSELs).

2. Description of the Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of mirror periods, each period including a high index of refraction layer and a low index of refraction layer. As light passes from a layer of one index of refraction to another, a portion of the light is reflected. By using a sufficient number of alternating layers, a high percentage of light can be reflected by the mirror. Typically, each layer within a mirror has a thickness of one-quarter wavelength of the optical field being produced in order to improve reflectivity.

An active region that includes a number of quantum wells is formed on the bottom mirror. The active region forms a PN junction sandwiched between the bottom mirror and a top mirror, which are of opposite conductivity type (i.e. a p-type mirror and an n-type mirror). Free carriers in the form of holes and electrons are injected into the quantum wells when the PN junction is forward biased by an electrical current. At a sufficiently high bias current the injected carriers form a population inversion in the quantum wells that produces optical gain. Optical gain occurs when photons in the active region cause electrons to transition from the conduction band to the valance band which produces additional photons. When the optical gain is equal to the loss in the two mirrors, laser oscillation occurs. The electrons in the quantum well conduction band are stimulated by photons to recombine with holes in the quantum well valence band. This process results in the stimulated emission of photons, which are coherent with the initiating photons.

The active region may also include an oxide aperture formed using one or more oxide layers formed in the top and/or bottom mirrors near the active region. The oxide aperture serves both to form an optical cavity and to direct the bias current through the central region of the cavity that is formed.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject free carriers into the active region. Recombination of the injected free carrier electrons from the conduction band quantum wells to the valence band quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss laser oscillation occurs and the laser is said to be at threshold bias and the VCSEL begins to 'lase' as the optically coherent photons are emitted from the top of the VCSEL.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An embodiment disclosed herein relates to a Vertical Cavity Surface Emitting Laser optimized for longer life of the Vertical Cavity Surface Emitting Laser. The Vertical Cavity Surface Emitting Laser comprises a quantum well, a Si doped layer disposed at about 26 nm or more from the quantum well, the Si doped layer being doped at about $<2\times10^{18}/cm^3$, and a undoped layer disposed between the Si doped layer and the quantum well, wherein the undoped layer is the layer closest to the quantum well.

A further embodiment disclosed herein relates to a Vertical Cavity Surface Emitting Laser optimized for longer life of the Vertical Cavity Surface Emitting Laser. The Vertical Cavity Surface Emitting Laser comprises quantum wells and undoped layers disposed with a total extent between 56 nm and 75 nm around the quantum wells, wherein the undoped layers are the semiconductor layer closest to the quantum well.

An additional embodiment disclosed herein relates to a Vertical Cavity Surface Emitting Laser (VCSEL) optimized for reduced parasitic lateral current under an oxide of the VCSEL. In the VCSEL, non-radiative recombination occurs at an oxide semiconductor boundary according to a non-radiative lifetime. The VCSEL comprises an active region including one or more quantum wells, wherein the active region comprises a high Al confinement region, the high Al being about >80% or more, an oxide layer comprising an aperture disposed near the active region, wherein vertically the center of the oxide layer is about ¾ wave optical thickness from the center of the quantum wells, an intermediate region between the active region and the oxide layer, the intermediate region comprising a direct bandgap material with radiative lifetimes that are less than non-radiative lifetimes, and a spacer region, the spacer region comprising an extra mirror period, wherein the extra mirror period comprises low Al and is configured to trap minority carriers to allow them to recombine radiatively in the intermediate region.

Another embodiment disclosed herein relates to a Vertical Cavity Surface Emitting Laser optimized to reduce resistance. The Vertical Cavity Surface Emitting Laser comprises an active region, a plurality of p doped mirror periods disposed on one side of the active region, the plurality of mirror periods comprising high doping and wherein the doping is periodic such that higher doped portions are configured to be located at about nulls of a standing optical wave in the Vertical Cavity Surface Emitting Laser, further wherein the mirror periods are doped at a minimum doping of $1 \times 10^{18}/cm^3$, and further wherein at least some of the higher doped portions of the doped mirror periods have a doping $>1e19/cm^2$, and an oxide layer disposed near the active region centered at the second null away from the active region.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Example VCSEL Structure

Figure 1:
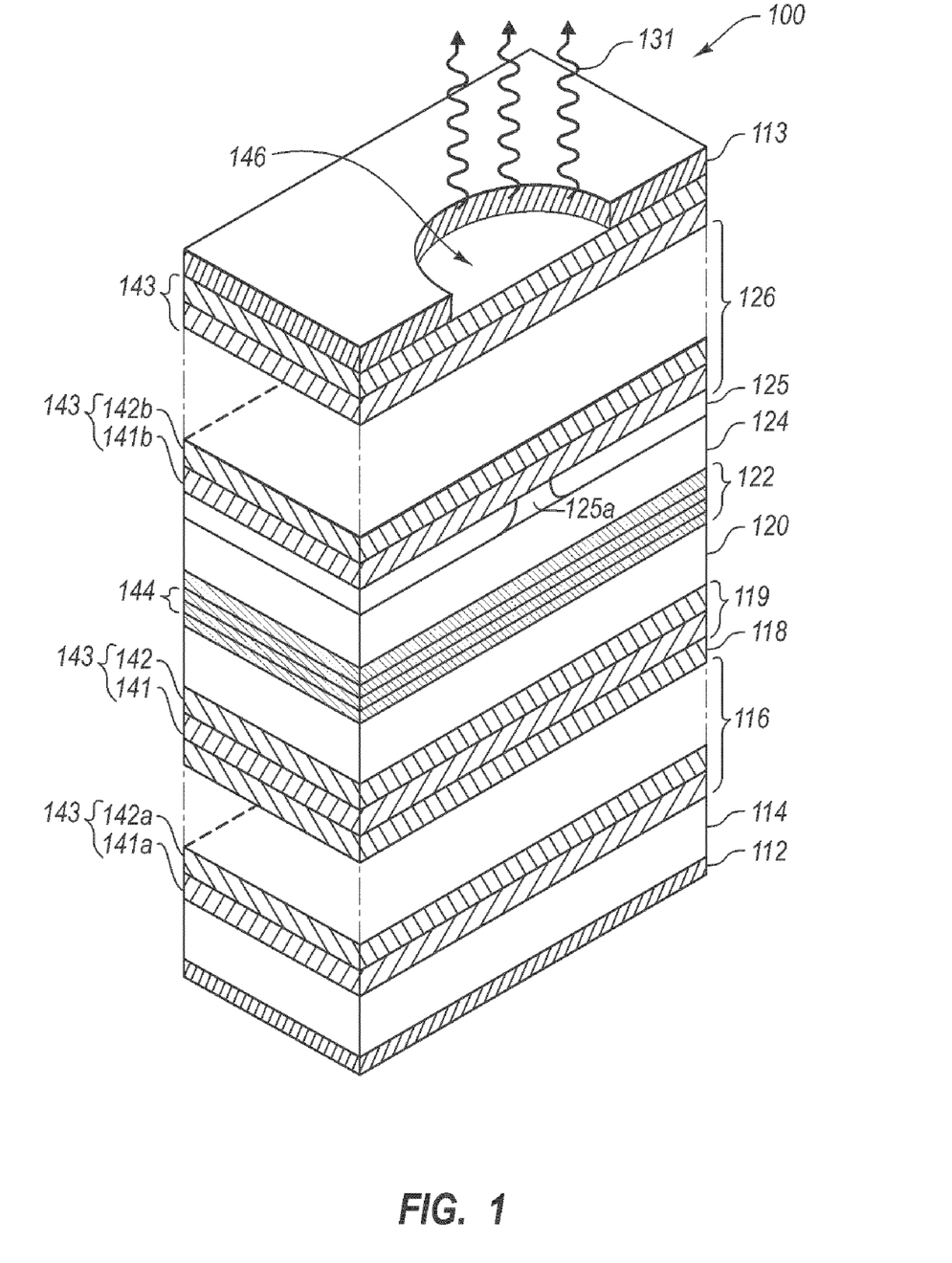
FIG. 1 is an illustration of an exemplary vertical cavity surface emitting laser (VCSEL) according to the present invention.

FIG. 1 shows a planar, current-guided, vertical cavity surface emitting laser (VCSEL) 100 having periodic layer pairs for top and bottom Bragg mirrors. In the illustrated VCSEL 100, a substrate 114 is formed on a bottom contact 112 and is doped with a first type of impurities (i.e. p-type or n-type dopant). In this example, the substrate 114 may be a gallium arsenide (GaAs) substrate. In other embodiments, the substrate 114 may be other material such as other III-V semiconductor materials. A bottom mirror stack 116 is formed on substrate 114 and a bottom confining layer 120 may be formed on bottom stack 116. The bottom confining layer 120 and a top confining layer 124, both of which may comprise one or more layers or regions, sandwich an active region 122. An upper mirror stack 126 is formed on the top confining layer 124. A metal layer 113 forms a contact on a portion of mirror stack 126. The VCSEL 100 structure may go through various etching, deposition and oxide growth stages during formation.

Stacks 116 and 126 can be distributed Bragg reflector (DBR) stacks. Each DBR stack 116 and 126 includes alternating layers 141a, 142a, 141b and 142b of high and low refractive index materials. Each alternating layer pair is called a mirror period 143. The optical thickness of each alternating layer pair is typically equal to an integral number, typically "1", of half the wavelengths of the laser to be constructed. The top mirror 126 may include about 20-25 mirror periods where each period includes a high index of refraction layer and a low index of refraction layer. The DBR stack 126 may have mirror periods having low doped portions with doping of $1 \times 10^{18}/cm^3$ and higher doped portions with a doping of $>1e19/cm^2$.

In the example shown, the bottom mirror 116 may include alternating layers of aluminum arsenide (AlAs) and GaAs, but can be made from other III-V semiconductor materials. Stacks 116 and 126 can be doped or undoped and the doping can be n-type or p-type depending on the particular VCSEL design. In conventional VCSEL designs, the bottom mirror 116 may include about 30 to 35 mirror periods.

In some embodiments, a cavity extension layer 118 is formed between the bottom stack 116 and the lower confinement layer 120. The cavity extension layer 118 may be a thick AlAs cavity that acts as an additional mirror layer. In embodiments where the AlAs cavity extension 118 is periodically doped, the more heavily doped portions of the AlAs cavity extension 118 may occur at or near nulls of a standing optical wave as will be discussed in more detail to follow. The thick AlAs cavity extension may be about one of 0.75, 1.25, 1.75, or 2.25 wavelengths thick, although other thicknesses are also contemplated.

In further embodiments, one or more alternating layer mirror pair layers 119 may be disposed between the cavity extension layer 118 and the lower confinement layer 120. As shown, the one or more alternating layers mirror pairs 141 and 142 form a mirror period 143. In one embodiment, layer 119 consists of two alternating layer mirror pairs.

The active region 122 includes quantum wells 144 for stimulating the emission of laser energy. The quantum wells 144 may also be referred to as the optical gain region. The quantum wells 144 are the locations where current through the active region causes the presence of injected carriers, holes and electrons, which cause a population inversion and optical gain. These electrons from the conduction band quantum well states combine with the holes in the valence band quantum well states (i.e. across the band gap) to cause the emission of photons 131. More detail of the active region 122 will be discussed in relation to FIG. 2.

In one embodiment, an oxidation layer 125 forming an aperture 125a may also be provided near a conduction layer region above the quantum wells 144 for directing bias current to the central region of the VCSEL active region 122. As illustrated in FIG. 1, in some embodiments the oxide layer 125 is thin and the aperture is 125a tapered to a sharp point. In such embodiments, the oxide layer is constructed such that within 0.1 microns of the tip the oxide layer is about <350 Angstroms and tapers to a thickness of at least 600 Angstroms at a distance from the aperture 125a of about 2-4 microns from the aperture. Alternatively, the oxide layer 125 may taper to at least 1000 Angstroms at a distance from the aperture 125a of about 2-4 microns from the aperture. In some embodiments, vertically the center of the oxide layer 125 is about ¾ wave optical thickness from the center of the quantum wells 144. In other words, the oxide layer is at a second null in a standing optical wave of the VCSEL as will be described in more detail to follow.

Metal contact layers 112 and 113 can be ohmic contacts that allow appropriate electrical biasing of VCSEL 100. When VCSEL 100 is forward biased with a voltage on contact 113 different than the one on contact 112, active region 122 emits light 131 which passes through stack 126. An aperture 146 may be provided through contact 113 to allow the emission of the photons 131. Although the contact layers 112 and 113 in the example VCSEL 100 are located on the top and bottom surfaces of the VCSEL, in other embodiments, p-type and n-type intracavity or intramirror contacts may be used.

While various layers of the epitaxial structure have been described as being formed on other layers, this does not require that the layers be formed directly on the other layers. Rather, other intervening layers may exist between a layer and the layer in which that layer is formed. Various portions of the present discussion may refer to several configurations of the VCSEL.

Figure 2:
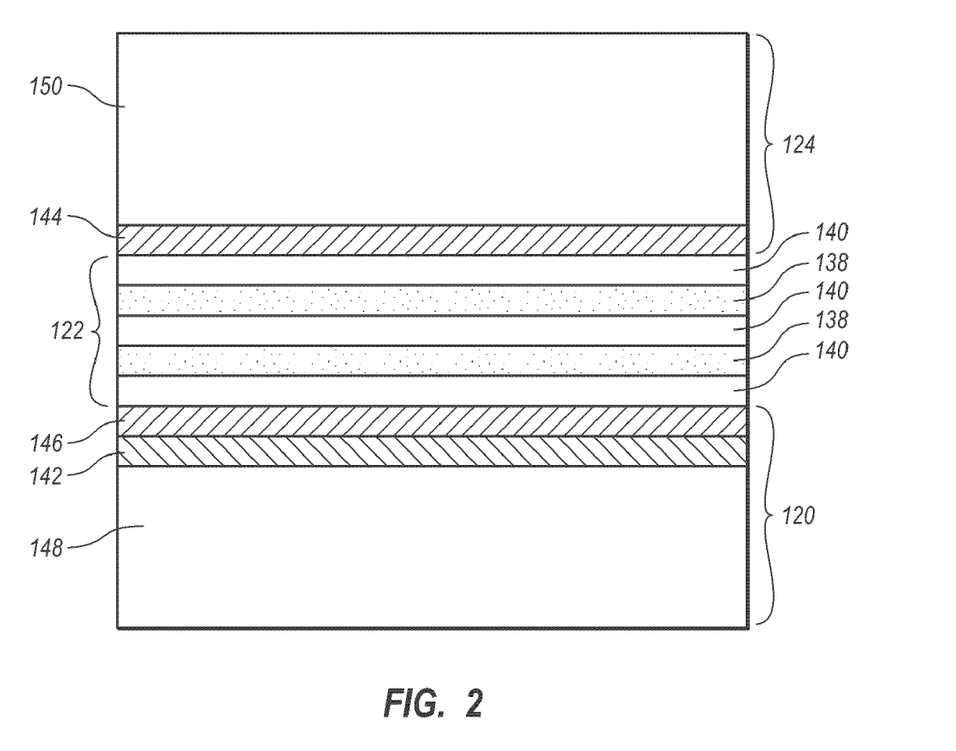
FIG. 2 illustrates the confining layers and active region of the VCSEL of FIG. 1 in more detail.

FIG. 2 illustrates the active region 122 and confining layers 120 and 124. Active region 122 is formed from one or more quantum wells 138 that are separated by quantum well barriers 140. In one embodiment, confining layers 120 and 124 include high aluminum content regions 142 and 144, respectively. The high aluminum content regions provide good carrier confinement in active region 122.

Confining region 120 includes a transition region 146 that is positioned between active region 122 and high aluminum content region 142. The combination of high aluminum content region 144 and the transition region 146 provide an injection structure with good carrier confinement and good electron injection.

Depending on the design of the VCSEL and the thickness of high aluminum content regions 142 and 144, the confining regions 120 and 124 can also include spacer layers 148 and 150, respectively. The spacer layers provide resonant spacing between mirrors and provide that the quantum wells of the active region are centered on a peak of the optical field.

In some embodiments, the high aluminum content regions 142 and 144 act as an intermediate region or layer between the oxide layer 125 and the spacer regions or layers 148 and 150. The high aluminum content regions 142 and 144 may comprise a direct bandgap material with radiative lifetimes that are less than non-radiative lifetimes. In further embodiments, the spacer regions 148 and 150 may combine with the high aluminum content regions 142 and 144 respectively to form an extra mirror period such as the mirror periods 143. As will be explained further, the extra mirror period comprises low Al and is configured to trap minority carriers to allow them to recombine radiatively in the high aluminum content regions 142 and 144.

The confining layers 120 and 124 and active region 122 may be formed from one or more types of semiconductor materials. Examples of suitable semiconductor materials include GaAs, AlAs, InP, AlGaAs, InGaAs, InAlAs, InGaP, AlGaAsP, AlGaInP, InGaAsP, InAlGaAs, SiGe, or the like.

The various layers and regions in the semiconductor devices of the invention are created, at least in part, by varying the composition of the semiconductor material. For example in one embodiment, the aluminum content of an III-V semiconductor material can be varied. In one embodiment, the semiconductor material is $Al_xGa_{1-x}As$, where x is between 0.0 and 1.0 (i.e., aluminum is 0.0% to 100%). $Al_xGa_{1-x}As$ is useful for making 850 nm VCSELs, which require high current densities and high optical output. In an alternative embodiment, the semiconductor material is $(Al_xGa_{1-x})$ InP where x is between 0.0 and 1.0 (i.e., aluminum is 0.0% to 100% for the AlGa fraction). The ratio of In to AlGa is typically selected to provide lattice matching and/or to provide a desired bandgap. In one embodiment the fraction of In in the AlGaInP system is about 0.51 of the type III materials.

Having described a general structure of a VCSEL, advantages and aspects of an 850 nm VCSEL for 17 Gigabit and higher applications in accordance with the present invention will now be explained. Such advantages may be practiced in the VCSEL of FIGS. 1 and 2, although the present invention is not limited to such VCSELs.

Quantum Wells for an 850 nm VCSEL for 17 Gigabit Applications

Indium containing quantum wells can be used to improve the characteristics of quantum wells lasers. This occurs because the strain caused by the lattice mismatch with the GaAs substrate causes the splitting of the otherwise degenerate heavy hole and the light hole bands and the heavy hole band being modified to have a low density of states, again due to the strain. In edge emitting lasers and diodes, these benefits are seen simply by adding indium to the quantum wells. The results on the properties of the quantum wells are that the transparency carrier density is reduced, and the differential gain is reduced. The result for the laser is a lower threshold current and a higher relaxation oscillation frequency. At the same time, these beneficial effects occur when the wavelength of the laser shifts to longer values. 980 nm edge emitters are commonly fabricated using this technology with excellent behavior.

The 850 nm VCSEL has been and continues to be designed at 850 nm because of the convenience of low cost GaAs or Si or Ge photodiodes which work well with 850 nm light and the relative simplicity of fabrication of 850 nm VCSELs. Because of this, the standards are very solidly set to 850 nm, making it difficult to use indium which shifts the gain peak of the quantum wells to longer wavelengths. As such, AlInGaAs quantum wells previously proposed or demonstrated have not had any advantage.

An optimization of AlInGaAs quantum wells in 850 nm VCSELs was performed by simulation. In the simulation, thinner InGaAs quantum wells were used to compensate for reductions in band gap. Dimensions for such quantum wells may be about 50 A with 4.8% indium. For narrower quantum wells, even more indium may be beneficial. Generally, as the quantum wells widen the required indium goes down reducing the benefit. As the quantum wells narrow the benefit increases with increased indium, but the wavelength control of the quantum wells becomes difficult as the gain wavelength becomes very strongly dependent on the quantum well width.

Injection Structure for Quantum Wells

Figure 3:
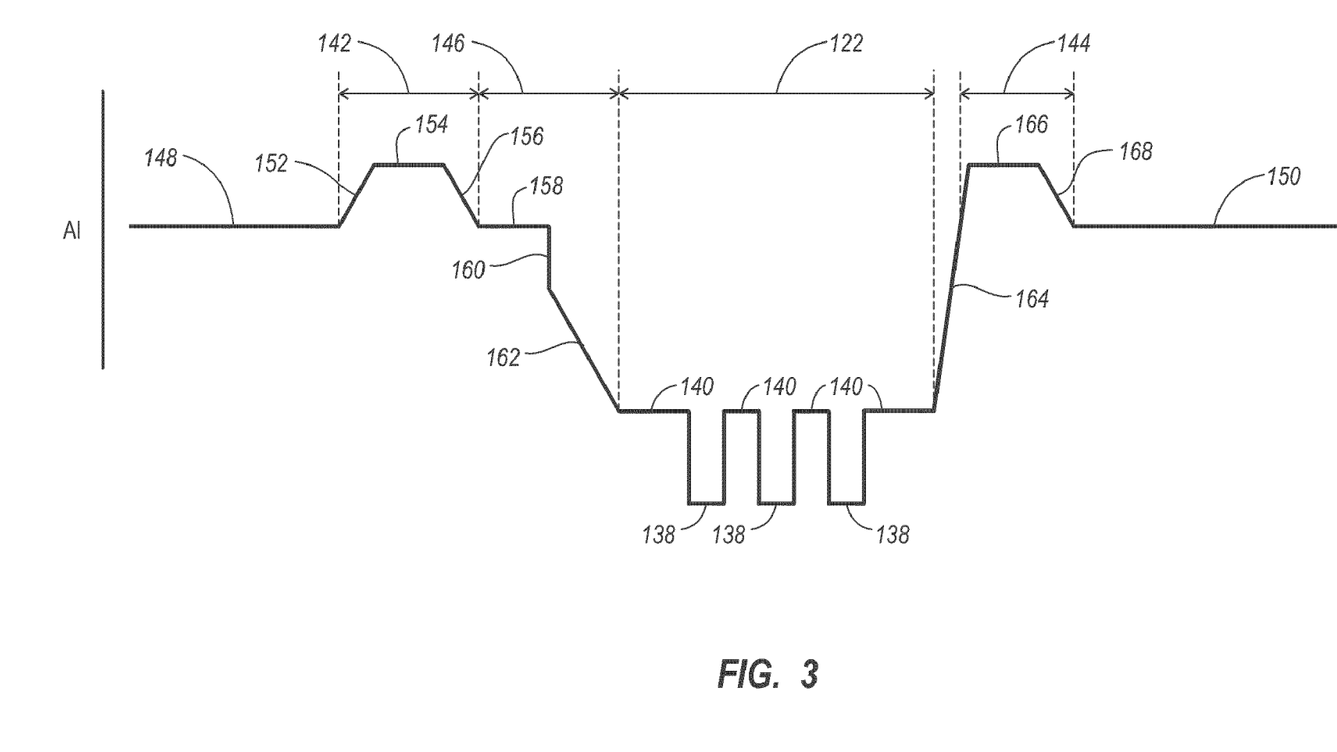
FIG. 3 is a diagram of an aluminum profile of a portion of a VCSEL according to the present invention.

Reference is now made to FIG. 3, which illustrates the aluminum content in an example portion of a VCSEL such as the VCSEL of FIGS. 1 and 2 according to one embodiment of the invention. The aluminum content is shown for active region 122, high aluminum confining regions 142 and 144, and transition region 146.

Beginning with spacer 148, the aluminum content in the spacer layer 148 is between 10% and 20%, preferably 16%. The aluminum content increases at ramp 152 to an aluminum content 154 of about 95% within high aluminum region 142. The high aluminum region 142 may be Si doped.

In transition region 146, the aluminum content ramps between the aluminum content 154 and the aluminum content of quantum well barrier 140. Transition region 146 includes a ramp 156, an intermediate structure 158, a step 160, and a ramp 162. The ramp 156 has an aluminum content that ramps from 95% to about 60% at structure 158. The step 160 and the ramp 162 have an aluminum content that ramps from about 60% to 25% at the barrier layer 140. In some embodiments, the transition region or layer 146 may be Si doped up to the structure 158 with the step 160 and ramp 162 being substantially undoped. In other embodiments, all of transition region 146 may be substantially undoped.

The active region 122 includes several steps that form quantum wells 138. A ramp 164 provides a transition between active region 122 and high aluminum content region 144. Ramp 164 has an aluminum content that ramps from about 25% to about 95% at 166 within high aluminum region 144. The ramp 168 ramps from 95% to the aluminum content in the spacer layer 150, which is between 10% and 20%, preferably 16%. The high aluminum region 144 may be Si doped. Further details of an injection structure are disclosed in commonly assigned, co-pending U.S. patent application Ser. No. 11/735,993.

Wear out of VCSELs is a fundamental life limiting problem. At high current densities used in higher data rate lasers, this may be a substantial problem. The cause of wear out has been discovered by the inventor to include the diffusion of silicon from silicon doped confinement layers, such as layers 148 and 150, which also act as electron injecting layers towards and into the quantum wells of the active region. This discovery method includes using light and current vs. voltage measurements and noticing that devices with silicon closer to the active region cause wear out to be more severe. Additionally, the discovery method includes simulating devices with silicon closer to the active region. The diffusion of silicon from the electron injecting layer towards and into the quantum wells of the active region causes an uneven distribution of carriers in the quantum wells resulting in lower gain and a subsequent high threshold current of the VCSEL.

To minimize this problem, the distance of the quantum wells to the closest Si doped layer (i.e., layers 148 or 150) should be at least about 26 nm and the silicon dopant in the layers should be about $<2\times10^{18}$/cm3 and preferably $1\times10^{18}$/cm3. Any extra dopants of any kind diffusing towards the quantum well will cause this problem, so the structure is designed to minimize this by having sufficient spacing between the dopants and the quantum wells.

In the embodiment disclosed in relation to FIG. 3, making step 160 and ramp 162 comprise a doped 15 nm ramp combined with an extended barrier 140 of undoped 12.5 nm may provide sufficient spacing between the Si doped layer 142 and the quantum wells. Locating the Si doped layer further from the quantum wells may further extend the life of the VCSEL. In the example illustrated, on the p-side a 12.5 nm undoped extended barrier 140 may be a sufficient spacing between the Si doped layer 144 and the quantum wells. In general the total distance for the undoped region should be implemented such that the sum of the undoped regions on both sides outside of the quantum wells is between 56 nm and 75 nm, and is optimally split so that more of it is on the n-side.

While in the above examples, reference has been made to undoped semiconductors, it should be understood by those of skill in the art that no semiconductor is truly undoped as there are residual background impurities. When reference is made to undoped here, it means that the semiconductor has an impurity concentration low enough that it is essentially undoped. In the present application, undoped means less than $3\times10^{17}$/cm3 of either n or p type dopant.

Figure 4:
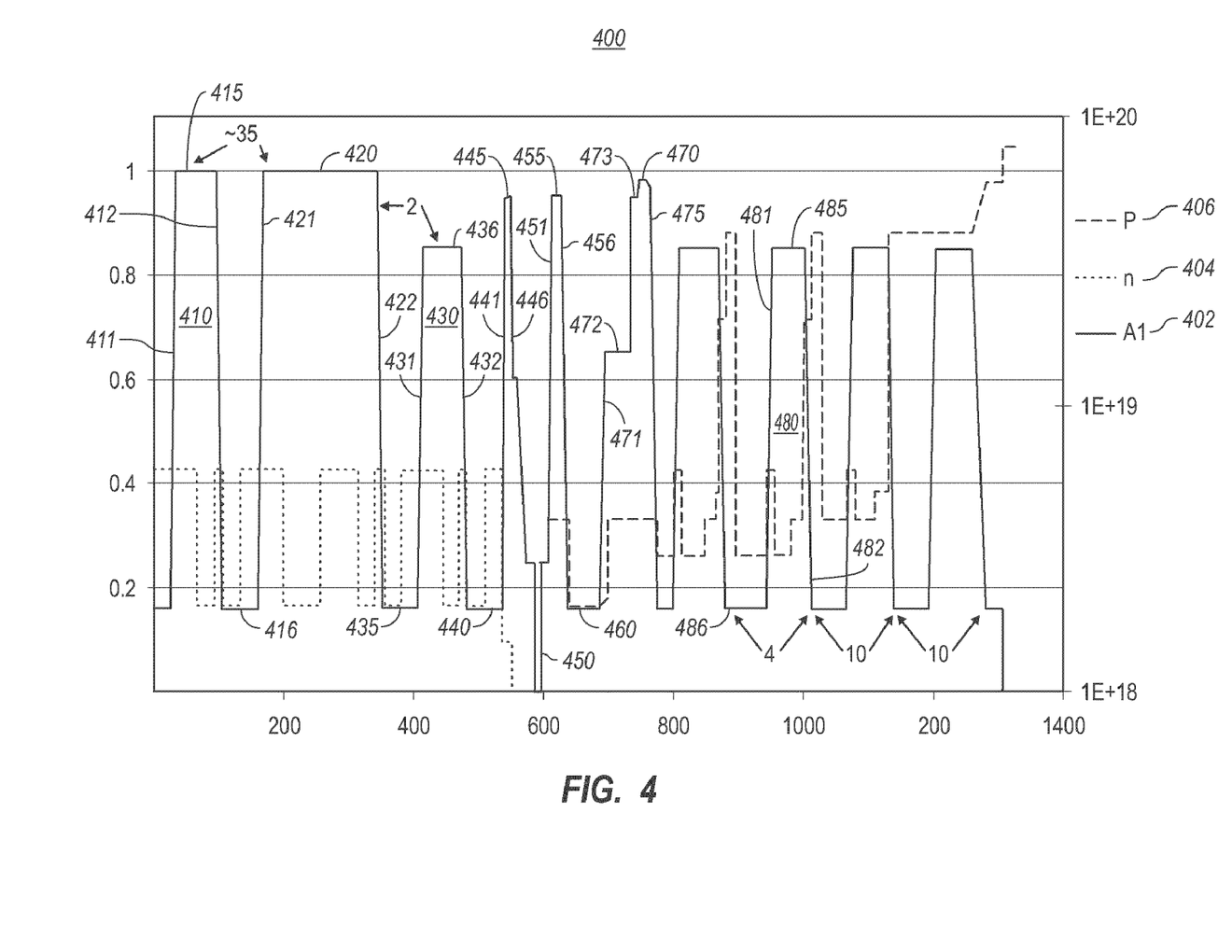
FIG. 4 is a diagram of an aluminum profile of a VCSEL according to the present invention.
Figure 5:
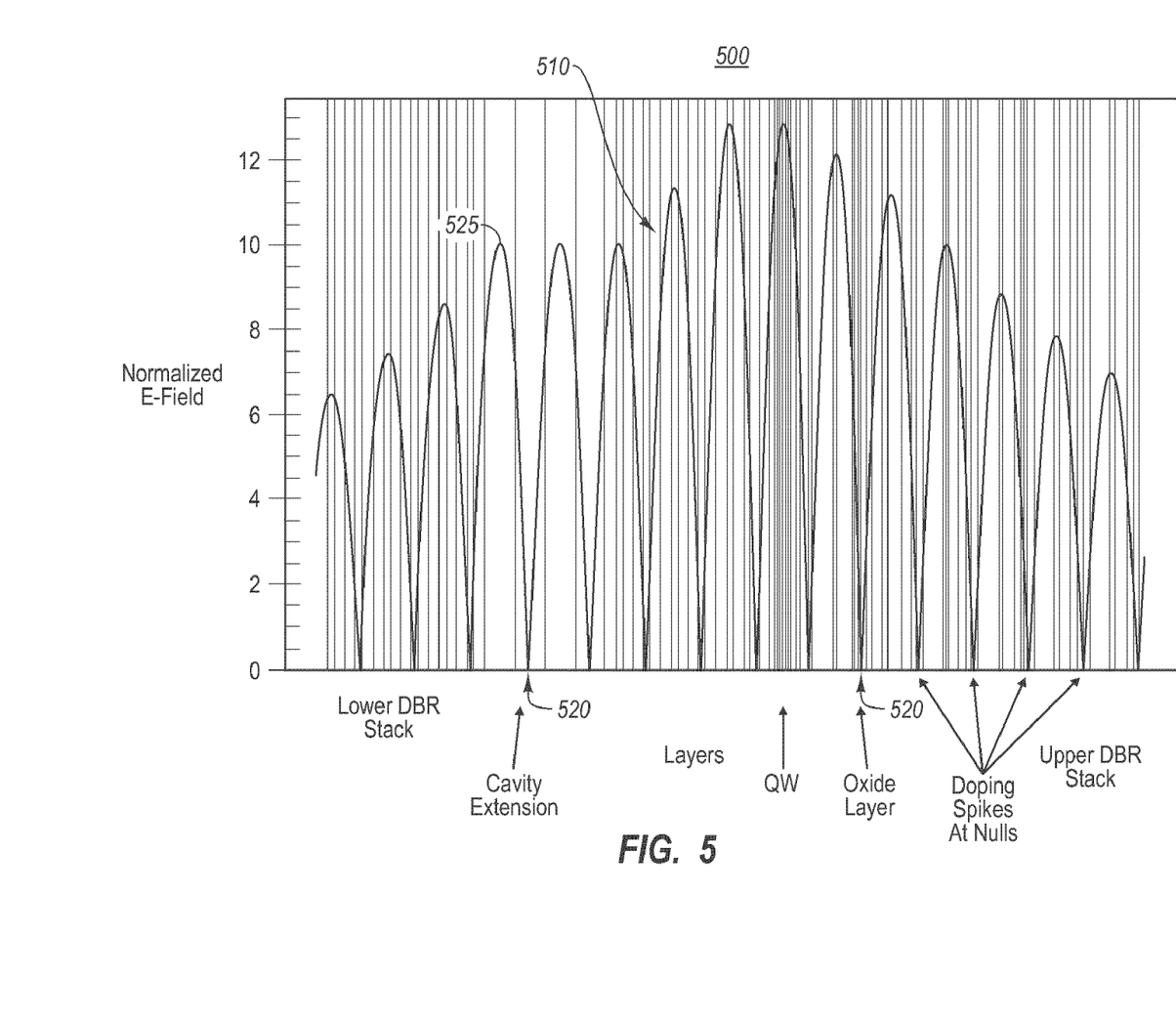
FIG. 5 is a diagram of a standing optical wave in a VCSEL according to the present invention.

Oxide Aperture, Confinement for Reliability, and Using the Spacer as a Mirror Period Attention is now made to FIGS. 4 and 5. FIG. 4 illustrates a plot 400 depicting the relationship between the compositional makeup 402 (identified by a solid line) of a VCSEL and a n-doping concentration 404 (identified by a dotted line) and a p-doping concentration 406 (identified by a dashed line) applied to the VCSEL, while FIG. 5 illustrates a plot 500 of standing optical wave 510 at the various layers of a VCSEL corresponding to the VCSEL of FIG. 4.

A scale is provided along the left-hand side of the plot 400 to describe the compositional makeup 402 of the VCSEL. The scale ranges from zero to one and represents the aluminum fraction in the alloy $Al_xG_{1-x}As$, and where a low X value produces a high refractive index and a high X value produces a low refractive index. For example, an aluminum value of 0.1 signifies that the group III portion of the alloy is 10% Al, and 90% Ga. However, it will be appreciated that while AlGaAs is used in the present example, the principles described herein are not limited to any particular composition, but may instead be applied to all types of compositions. A second scale is also provided along the right hand side of the plot 400 for providing context for the doping level 404. The second scale describes the acceptor concentration per centimeter cubed within the VCSEL.

The x-axis of plot 500 show layers that correspond to the layers of plot 400. That is, the left side of plot 500 corresponds to a bottom DBR mirror stack while the right side corresponds to the upper DBR mirror stack. The portion of the graph in between corresponds to the remaining layers. Those layers that are of particular importance to the present discussion are labeled. The y-axis of plot 500 shows a normalized E-field.

The plot 400 of FIG. 4 will now be explained in relation to the VCSEL of FIGS. 1 and 2. As shown, the plot 400 includes a lower DBR stack 410, which may correspond to bottom mirror stack 116. The lower DBR stack 410 in one embodiment is comprised of 35 alternating layer pairs 141*a* and 142*a* (comprising a mirror period 143), which is denoted by the 35 shown on plot 400. In each alternating layer pair, a high aluminum layer 415 of about 100% aluminum content and a low aluminum layer 416 between 10% and 20%, preferably 16%, are separated by a transitional ramp 411 that transitions the aluminum content from about 16% to about 100% and a transitional ramp 412 that transitions the aluminum content from about 100% to about 16%.

A transitional ramp 421 transitions from the last layer 416 to a cavity extension 420, which may correspond to cavity extension 118. The transitional ramp 421 has an aluminum content that ramps from about 16% to about 100% at the cavity extension 420. A transitional ramp 422 has an aluminum content that ramps from about 100% to between 10% and 20%, preferably 16%, as it transitions to the next layers.

The next layer 430, which may correspond to layers 119, is comprised of two alternating layer pairs 141 and 142 (comprising a mirror period 143), which is denoted by the 2 shown on plot 400. In each alternating layer pair, a high aluminum layer 436 of about 100% aluminum content and a low aluminum layer 435 between 10% and 20%, preferably 16%, are separated by a transitional ramp 431 that transitions the aluminum content from about 16% to about 100% and a transitional ramp 432 that transitions the aluminum content from about 100% to about 16%.

The last transitional ramp 432 transitions to a spacer 440, which may correspond to spacer 148, having an aluminum content between 10% and 20%, preferably 16%. The aluminum content increases from 16% to about 95% at a transitional ramp 441 that transitions to a confinement layer 445, which may correspond to layer 142, having an aluminum content of about 95%.

A transitional ramp 446, which may correspond to transitional ramp 146, transitions from about 95% aluminum content to about 25% at the barrier layer 140. The aluminum content then goes to zero at the quantum wells 450, which may correspond to the quantum wells 138 of active region 122.

A transition ramp 451, transitions the aluminum content from the about 25% of the barriers layers 140 to an aluminum content of about 95% of a confinement layer 455, which may correspond to layer 144. A transitional ramp 456 then transitions the aluminum content from about 95% to an aluminum content between 10% and 20%, preferably 16% of a spacer 460, which may correspond to the spacer 150.

A transitional ramp 471 transitions from about 16% aluminum content to about 95% aluminum content at the oxide layer 470, which may correspond to oxide layer 125. Note that transitional ramp 471 includes steps 472 and steps 473 as it tapers to a point as previously described. A transitional ramp 475 transitions the aluminum content from about 95% to between 10% and 20%, preferably 16% as it transitions to an upper DBR mirror 480, which may correspond stack 126.

The upper DBR stack 480 in one embodiment is comprised of 24 or 25 alternating layer pairs 141*b* and 142*b* (comprising a mirror period 143), which is denoted by the numbers shown on right side of plot 400. In each alternating layer pair, a high aluminum layer 485 of about 100% aluminum content and a low aluminum layer 486 between 10% and 20%, preferably 16%, are separated by a transitional ramp 481 that transitions the aluminum content from about 16% to about 100% and a transitional ramp 482 that transitions the aluminum content from about 100% to about 16%.

Reference is again made to FIG. 4 and FIG. 5. As discussed above, plot 400 also shows the doping concentrations 404 and 406 and plot 500 shows a standing optical wave 510 at the various layers of a VCSEL corresponding to the VCSEL of plot 400. As shown in FIG. 4, n-doping 404 occurs in the portion of the VCSEL below the active region that contains the quantum wells. As illustrated, the n-doping 404 ranges from a relatively low doping concentration to a moderate concentration. In addition, plot 500, when viewed in conjunction with plot 400, shows that the levels of highest n-doping occur at nulls in the standing optical wave 510 and that the levels of lowest n-doping occur at peaks in the standing optical wave 510. For example, plots 400 and 500 show that the cavity extension 118 includes a null 520 in the standing optical wave 510 at a period of higher n-doping and a peak 525 in the standing optical wave 510 at a period of lower n-doping.

As further illustrated, p-doping 406 occurs in the portion of the VCSEL above the active region that contains the quantum wells. As illustrated, the p-doping ranges from a relatively low doping concentration to a high doping concentration, where the high doping concentration generally occurs at higher levels of aluminum concentrations. In addition, plot 500, when viewed in conjunction with plot 400, shows that the levels of highest p-doping occur at nulls in the standing field 510 and that the levels of lowest p-doping occur at peaks in the standing field 510. For example, plots 400 and 500 show that the oxide layer 125 has a center that is about ¾ wave optical thickness from the center of the quantum wells. That is, the oxide layer 125 is at a second null 260 in a standing electrical field 510 of the VCSEL.

In some embodiments, it is desirable to place the oxide aperture 125 close to the active region 122 to reduce parasitic lateral current under the oxide. However, reliability may be decreased when this is done. The decrease in reliability comes from dislocations propagating from the oxide 125 into the active region 122 where the quantum wells 138 are located. Because the oxide is a non single crystal surface it is a source of dislocations which become dark line defects as they propagate and leave a trail of dislocation loops. Propagation of dislocations in this manner requires non-radiative recombination occurring at the oxide semiconductor boundary as well as through the region between the quantum wells and the oxide. This occurs because of electrons spilling out of the active region, primarily at high temperatures, and recombining at the oxide semiconductor interface and the intervening region.

Advantageously, the principles of the present invention allow for the oxide layer 125 to be placed close to active region while minimizing dislocations discussed above. The dislocations are minimized by two design features. First, an extra confinement at the quantum wells to avoid minority carrier spillover should be provided. As discussed in relation to FIG. 3 above, the confinement layers 142 and 144 provide extra confinement for the carriers.

Second, a direct band gap material with radiative lifetimes much less than the non radiative lifetimes should be placed between the oxide layer and the active region. This material also acts as a well to trap the minority carriers. In embodiments of the present invention, the extra mirror period portion in the spacer layer 150, which has a low Al concentration as discussed, is used for a well to trap the minority carriers and allow them to recombine radiatively because spacer layer 150 is comprised of a direct gap material with a short radiative lifetime. Thus, the principles of the present invention provide an optimized VCSEL where the spacer layer 150 is modified to include a minority carrier trap for radiative recombination, the oxide layer is close to the quantum well, and confinement of the quantum wells is enhanced.

In other embodiments, the oxide layer 125 interface represents a surface which has traps in the band gap. Sub-energy band gap light such as extremely intense laser light can be absorbed by these traps, releasing minority carriers which can recombine non-radiatively causing the drift of dislocations from the oxide layer as previously discussed. The principles of the present invention provide embodiments that minimize this problem by placing the oxide layer 125 at a null of the standing optical field 125 and by keeping the oxide thin and having a sharp point at the tip. As previously described above, oxide layer 125 includes an oxide that is thin and is tapered to a point. In addition, plot 500 shows that oxide layer 125 is placed at the second null of standing optical wave.

Minimizing Resistance

One great challenge with high speed directly modulated devices is to make the device small without increasing the resistance and at the same time keeping absorption low. It may be important to keep absorption low because it degrades device performance in several ways. It increases threshold current, decreases slope efficiency, and makes the change in slope efficiency over temperature worse. There are several things that can be done to compensate so as to improve performance.

High periodic doping with or without asymmetric mirror periods can be used. Examples of these structures are illustrated in commonly assigned, co-pending U.S. patent application Ser. No. 11/963,365 titled "ASYMMETRIC DBR PAIRS COMBINED WITH PERIODIC AND MODULATION DOPING TO MAXIMIZE CONDUCTION AND REFLECTIVITY, AND MINIMIZE ABSORPTION" filed Dec. 21, 2007, which is incorporated herein in its entirety by this reference.

Conduction layers can be brought closer to the active region. Conduction layers on the top of a VCSEL reduce the lateral resistance. In addition, by extending the conduction layers further down into the structure, the lateral resistance is further reduced as is the vertical resistance.

The result of the high periodic doping and increasing the portion of the mirrors which are conduction layers, thus bringing the conduction layers closer to the active region, is a much lower sheet resistance for the p-mirror than is typically used for VCSELs. The lateral resistance of a given size device becomes much smaller. The reduction of vertical resistance of the device is much more limited. Vertically the resistance is primarily limited by conduction through the compositional ramps. This is reduced by suitable doping profiles in the ramps as well as by heavy doping throughout the mirror periods furthest from the active region conduction layers.

In addition, the oxide can be placed closer to the active region. This eliminates vertical conduction distance in the region of highest current density reducing resistance. In addition, it reduces parasitic lateral current under the oxide.

Further, the minimum doping in the structure which is used near peaks of the optical field can be increased. However, when this is done, one should be careful to balance the minimum doping increase to avoid excess free carrier absorption.

By combining periodic doping, a thick conduction region, appropriate doping at the ramps, and the aperture oxide closer to the quantum wells, a 6-7 micron aperture device with around 50 ohms DC resistance can be made. The sheet resistance of the upper p-mirror for such a device is <28 ohms. Some embodiments may be <25 ohms. On particular embodiment is designed such that the sheet resistance of the upper p-mirror is about 20 ohms RMS Spectral Bandwidth The RMS spectral bandwidth specification for 14-17 Gigabyte devices is likely to be ~0.65 nm. This is a challenge because these devices will operate at higher multiples of threshold current than slower speed devices. Additionally, the higher current densities will cause more modes to be allowed due to thermal lensing and generally cause higher spectral bandwidth. This is caused because the index of refraction increases with higher temperature causing an extra radial confinement due to the radial thermal gradients. This may also be a challenge simply because the sidebands created by modulation cause a substantial extra spectral bandwidth. These challenges may be dealt with in a number of ways:

Embodiments may keep optical confinement due to the oxide low by placing the oxide on a null, keeping it thin and making it sharply pointed.

Additionally, embodiments may be implemented to keep optical confinement due to thermal lensing low by thermal design. The lower mirror has AlAs as part of the DBR stack, as well as a thick periodically doped AlAs spacer which conduct heat and minimize thermal lensing. Additionally, embodiments may use AlAs in the top mirror.

Additionally, the AlAs spacer allows for more mode expansion reducing the confined number of modes and therefore reducing spectral bandwidth. The placement of the AlAs spacer should be as close to the active region as processing allows. When the depression is etched to expose the intentionally oxidized layer its bottom should have sufficient vertical spacing to the AlAs spacer that the AlAs spacer will not be oxidized. This can be enhanced, for example, by using the InGaAs quantum wells as etch stops.

Reduced Internal Capacitance

The internal capacitance may be reduced by bringing in the isolation implant as far as is possible and still maintaining adequate conduction. The layout dimensions for this typically would be ~9 microns with approximately 1.5 to 2 microns of lateral implant straggle giving an effective inner radius of 7 to 7.5 microns. In addition, the oxide can be tapered to be sharp at the tip as required for spectral bandwidth, but increase to a substantially larger value away from the aperture. For example near the tip (e.g. about 0.1 microns or less) it should be <350 Angstroms, and at about 2 microns further away it should be greater than 600 Angstroms and can taper to larger values. In addition, a single buried implant at a depth approximately coincident with the oxide can be used to create an insulating region which reduces the parasitic capacitance. Nominally this would have a radius half way between that of the isolation implant and the oxide aperture.

Mode Killer Structure

Some embodiments may also include a mode killer structure which uses a coupled cavity. By using a nitride oxide ¼ wave pair on top of a DBR mirror of the VCSEL, reflectance is enhanced causing a reduction in threshold and slope efficiency. By etching ¼ wave of semiconductor from the center of the device a coupled cavity is created which greatly reduces the reflectance. This reduces the number of modes and thus reduces spectral bandwidth.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A Vertical Cavity Surface Emitting Laser optimized for reduced parasitic lateral current under an oxide of the Vertical Cavity Surface Emitting Laser, wherein non-radiative recombination occurs at an oxide semiconductor boundary according to a non-radiative lifetime, the Vertical Cavity Surface Emitting Laser comprising:
   an active region including one or more quantum wells, wherein the active region comprises a high Al confinement region, the high Al being about >80% or more;
   an oxide layer comprising an aperture disposed near the active region, wherein vertically the center of the oxide layer is about ¾ wave optical thickness from the center of the quantum wells;
   an intermediate region between the active region and the oxide layer, the intermediate region comprising a direct bandgap material with radiative lifetimes that are less than non-radiative lifetimes, and
   a spacer region, the spacer region comprising an extra mirror period, wherein the extra mirror period comprises low Al and is configured to trap minority carriers to allow them to recombine radiatively in the intermediate region.

2. The Vertical Cavity Surface Emitting Laser of claim 1, further comprising:
   a lower or upper mirror comprising AlAs as part of a Distributed Bragg Reflector stack; and
   a thick AlAs cavity extension disposed at the lower mirror, and wherein the thick AlAs cavity extension act as an additional mirror layer, and wherein the AlAs cavity extension is periodically doped such that more heavily doped portions of the AlAs cavity extension occur at or near nulls of a standing electrical field.

3. The Vertical Cavity Surface Emitting Laser of claim 2, wherein the thick AlAs cavity extension is about one of 0.75, 1.25, 1.75, or 2.25 wavelengths thick.

4. The Vertical Cavity Surface Emitting Laser of claim 1, wherein the oxide layer is configured to be located at a null of a standing optical wave in the Vertical Cavity Surface Emitting Laser.

5. The Vertical Cavity Surface Emitting Laser of claim 1, wherein the oxide layer is thin and has a sharp point.

6. The Vertical Cavity Surface Emitting Laser of claim 5, wherein the oxide layer is constructed such that within 0.1 microns of the tip the oxide layer is about <350 Angstroms and tapers to a thickness of at least 600 Angstroms at a distance from the aperture of about 2-4 microns from the aperture.

7. The Vertical Cavity Surface Emitting Laser of claim 6, wherein the oxide layer tapers to at least 1000 Angstroms at a distance from the aperture of about 2-4 microns from the aperture.

8. The Vertical Cavity Surface Emitting Laser of claim 1, wherein the intermediate region and the spacer region are the same region.

* * * * *